(12) United States Patent
Na et al.

(10) Patent No.: US 10,096,700 B2
(45) Date of Patent: Oct. 9, 2018

(54) POWER SEMICONDUCTOR DEVICE COMPRISING TRENCH STRUCTURES

(71) Applicant: Magnachip Semiconductor, Ltd., Cheongju-si (KR)

(72) Inventors: Kwang Ho Na, Seongnam-si (KR); Seung Wook Song, Cheongju-si (KR); Yong Hun Kim, Goryeong-gun (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 4 days.

(21) Appl. No.: 15/146,444

(22) Filed: May 4, 2016

(65) Prior Publication Data

US 2017/0069741 A1    Mar. 9, 2017

(30) Foreign Application Priority Data

Sep. 8, 2015    (KR) .................. 10-2015-0126928

(51) Int. Cl.
| | |
|---|---|
| *H01L 29/66* | (2006.01) |
| *H01L 29/739* | (2006.01) |
| *H01L 29/10* | (2006.01) |
| *H01L 29/08* | (2006.01) |
| *H01L 29/417* | (2006.01) |
| *H01L 29/06* | (2006.01) |
| *H01L 29/40* | (2006.01) |
| *H01L 29/423* | (2006.01) |

(52) U.S. Cl.
CPC ...... *H01L 29/7397* (2013.01); *H01L 29/0696* (2013.01); *H01L 29/0847* (2013.01); *H01L 29/1095* (2013.01); *H01L 29/407* (2013.01); *H01L 29/41741* (2013.01); *H01L 29/4236* (2013.01); *H01L 29/42376* (2013.01)

(58) Field of Classification Search
CPC ............ H01L 29/7397; H01L 29/0696; H01L 29/0847
USPC ........................................................ 257/139
See application file for complete search history.

(56) References Cited

U.S. PATENT DOCUMENTS

| | | | |
|---|---|---|---|
| 6,818,945 B2 | 11/2004 | Kawaguchi et al. | |
| 8,441,046 B2 | 5/2013 | Bobde et al. | |
| 8,735,974 B2 | 5/2014 | Senoo | |
| 9,099,522 B2 | 8/2015 | Onozawa | |
| 9,281,368 B1* | 3/2016 | Lee | H01L 29/66484 |
| 9,299,695 B2 | 3/2016 | Matsushita | |

(Continued)

*Primary Examiner* — Caleb Henry
(74) *Attorney, Agent, or Firm* — NSIP Law

(57) ABSTRACT

A power semiconductor device includes a semiconductor substrate, trench structures comprising a first, a second, a third and a fourth trench structure formed in the substrate, a second conductivity type body region formed between the trench structures, a first conductivity type source region formed in the second conductivity type body region, and an emitter electrode and a gate pad formed over the substrate, wherein each trench structure includes a top electrode and a bottom electrode, and each top electrode is insulated from the corresponding bottom electrode, and wherein the first trench structure is symmetric to the fourth trench structure, and the second trench structure is symmetric to the third trench structure, and wherein the first trench structure is not identical to the second trench structure, and wherein no first conductivity type source region is formed to be adjacent to the second trench structure and the third trench structure.

23 Claims, 6 Drawing Sheets

(56) References Cited

U.S. PATENT DOCUMENTS

| | | | |
|---|---|---|---|
| 2002/0030237 A1* | 3/2002 | Omura | H01L 29/0634 257/397 |
| 2007/0210350 A1* | 9/2007 | Omura | H01L 23/4824 257/287 |
| 2010/0314682 A1* | 12/2010 | Yilmaz | H01L 29/0661 257/328 |
| 2012/0025874 A1* | 2/2012 | Saikaku | H01L 29/1095 327/109 |
| 2012/0061753 A1* | 3/2012 | Nishiwaki | H01L 29/407 257/331 |
| 2014/0027813 A1* | 1/2014 | Kuruc | H01L 29/66348 257/139 |
| 2016/0336394 A1* | 11/2016 | Hu | H01L 29/0623 |
| 2016/0359029 A1* | 12/2016 | Zeng | H01L 29/7397 |
| 2017/0162689 A1* | 6/2017 | Hu | H01L 29/7813 |

* cited by examiner

POWER SEMICONDUCTOR DEVICE COMPRISING TRENCH STRUCTURES

CROSS-REFERENCE TO RELATED APPLICATION(S)

This application claims the benefit under 35 USC 119(a) of Korean Patent Application No. 10-2015-0126928 filed on Sep. 8, 2015 in the Korean Intellectual Property Office, the entire disclosure of which is incorporated herein by reference for all purposes.

BACKGROUND

1. Field

The following description relates to a power semiconductor device. The following description also relates to a split-poly gate structure. Such a split-poly gate structure minimizes a gate capacitance and increases a switching speed.

2. Description of Related Art

High-performance electronic equipment having a small size is helpful in the field of power electronics. Thus, performance characteristics of a power semiconductor device, such as ability to withstand high voltage and high current operation, and low-loss, low-noise operation are improving.

Accordingly, an Insulated Gate Bipolar Transistor (IGBT) was developed to address these issues. However, a trench IGBT structure has an unwanted large gate capacitance. There are many efforts ongoing to reduce the gate capacitance in the trench structure. Various split-poly gate structures are proposed, but their structure has had still lower switching speed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments overcome the above disadvantages and other disadvantages not described above. Also, the embodiments are not required to overcome all of the disadvantages described above, and an embodiment possibly does not overcome any of the problems described above.

In one general aspect, a power semiconductor device includes a semiconductor substrate, trench structures including a first, a second, a third and a fourth trench structure formed in the substrate, a second conductivity type body region formed between the trench structures, a first conductivity type source region formed in the second conductivity type body region, and an emitter electrode and a gate pad formed over the substrate, wherein each trench structure comprises a top electrode and a bottom electrode, and each top electrode is insulated from a corresponding bottom electrode, and wherein the first trench structure is symmetric to the fourth trench structure, and the second trench structure is symmetric to the third trench structure, and wherein the first trench structure is different from the second trench structure, and wherein no first conductivity type source region is formed to be adjacent to the second trench structure and the third trench structure.

The top electrode and the bottom electrode of the first trench structure may be connected to the gate pad and the emitter electrode, respectively, and the top electrode and the bottom electrode of the second trench structure may be connected to the emitter electrode and the gate pad, respectively.

The top electrode and the bottom electrode of the first trench structure may be connected to the gate pad and the emitter electrode, respectively, and both the top electrode and the bottom electrode of the second trench structure may be connected to the emitter electrode.

The second conductivity type body region may have a shallower depth than that of the top electrode of the trench structures with respect to the top surface of the substrate.

The first conductivity type well region may overlap with both the top electrode and the bottom electrode of the trench structures.

The first conductivity type well region may have a higher impurity concentration than that of the first conductivity type drift region.

The drift region may include a first epitaxial layer and a second epitaxial layer, wherein the first epitaxial layer has a higher impurity concentration than that of the second epitaxial layer.

The power semiconductor device may further include a first conductivity type drift region formed in the substrate, surrounding a bottom portion of the trench structure, a first conductivity type well region formed over the first conductivity type drift region, and a drain electrode formed on the bottom surface of the substrate.

The top electrode may have a smaller length than that of the bottom electrode.

No channel region may be formed in the body region adjacent to the second trench structure and the third trench structure.

In another general aspect, a power semiconductor device includes a semiconductor substrate including first, second, third, and fourth trench structures, wherein a second conductivity type body region is formed between each of the trench structures, wherein a first conductivity type source region is formed in the second conductivity type body region, wherein no first conductivity type source region is formed to be adjacent to the second trench structure and the third trench structure, wherein each trench structure comprises a top electrode and a bottom electrode, and wherein each top electrode is insulated from a corresponding bottom electrode.

The power semiconductor device may further include an emitter electrode and a gate pad formed over the substrate.

The top electrode and the bottom electrode of the first trench structure may be connected to the gate pad and the emitter electrode, respectively, and the top electrode and the bottom electrode of the second trench structure may be connected to the emitter electrode and the gate pad, respectively.

The top electrode and the bottom electrode of the first trench structure may be connected to the gate pad and the emitter electrode, respectively, and both the top electrode and the bottom electrode of the second trench structure may be connected to the emitter electrode.

The second conductivity type body region may have a shallower depth than that of the top electrode of the trench structures with respect to the top surface of the substrate.

The first conductivity type well region may overlap with both the top electrode and the bottom electrode of the trench structures.

The first conductivity type well region may have a higher impurity concentration than that of the first conductivity type drift region.

The power semiconductor device may further include a first conductivity type drift region formed in the substrate, surrounding a bottom portion of the trench structure, a first conductivity type well region formed over the first conductivity type drift region, and a drain electrode formed on the bottom surface of the substrate.

The top electrode may have a smaller length than that of the bottom electrode.

No channel region may be formed in the body region adjacent to the second trench structure and the third trench structure.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
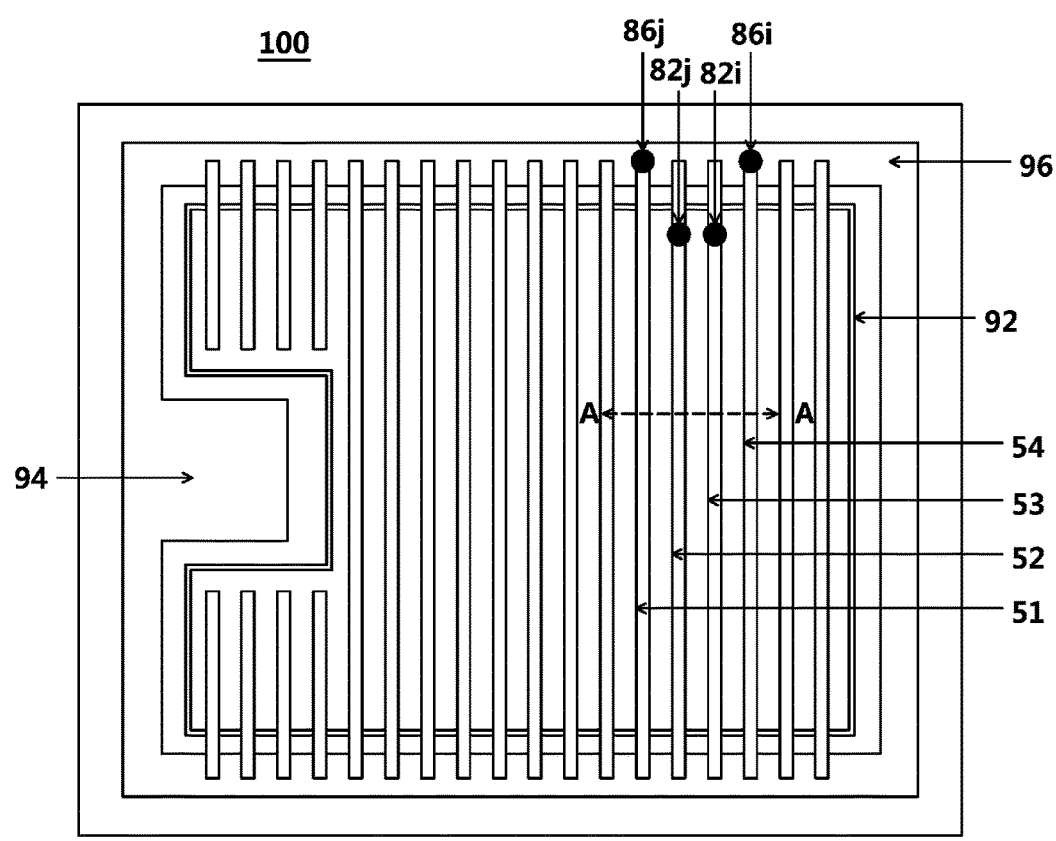
FIG. 1A is a plan view illustrating a power semiconductor device 100 according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In the following description, the same drawing reference numerals are used for the same elements, even in different drawings. The matters defined in the description, such as detailed constructions of terms and elements, are provided to assist in a comprehensive understanding of the present examples. Accordingly, it is understood that it is possible for the examples to be carried out without all of these specifically defined matters. Also, well-known functions or constructions are not described in detail to avoid obscuring the examples with unnecessary detail.

While the expressions such as "first" or "second" are used to refer to various elements, the elements are not intended to be limited by these expressions. Such expressions are used only for the purpose of distinguishing one element from the other when referring to such elements.

The expressions presented are used herein only for the purpose of explaining specific examples and are not intended to place limits on the present examples. An expression in singular form also encompasses plural meaning, unless otherwise specified. Throughout the description, the expression "comprise" or "have" is used only to designate the existence or presence of a characteristic, number, step, operation, element, component or a combination of such that is described herein, but not to preclude the possibility of existence of one or more of the other characteristics, numbers, steps, operations, elements, components or combinations of these features or other appropriate additional features.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

The examples are described more fully subsequently with reference to the accompanying drawings, in which certain embodiments are shown.

The embodiments provide a power semiconductor device configured to sufficiently reduce the gate capacitance to provide improved operation. Further, the present description provides a power semiconductor device with improved switching speed to provide improved operation, as a result of reduction of the gate capacitance.

FIG. 1A is a plan view illustrating a power semiconductor device 100 according to an embodiment. Straight lines 51, 52, 53, 54 are a plurality of the trench structures 51, 52, 53, 54 in which are filled by conductive materials, such as poly-Si materials. The trench structures are extended to a gate bus 96 which are formed by conductive metal layer, such as Al, W, Cu. The gate bus 96 surrounded the trench structures 51, 52, 53, 54 and its shape is like a single line. The gate electrodes 62, 68 (see FIG. 1B) formed in the trench structures 51, 54 are electrically connected to gate bus region 96 using gate contact plugs 86i, 86j. The gate bus 96 is electrically connected to a gate pad 94 to receive a gate voltage. The gate pad 94 has larger width than that of the gate bus 96. A single big emitter electrode 92 covers almost area of trench structures 51, 52, 53, 54, however it is electrically isolated from the gate bus 96. Using emitter contact plugs 82i, 82j, the emitter electrodes 61, 64, 66, 67 located in the trench structure are electrically connected to the emitter electrode 92 which covers the trench structures 51, 52, 53, 54.

Figure 1B:
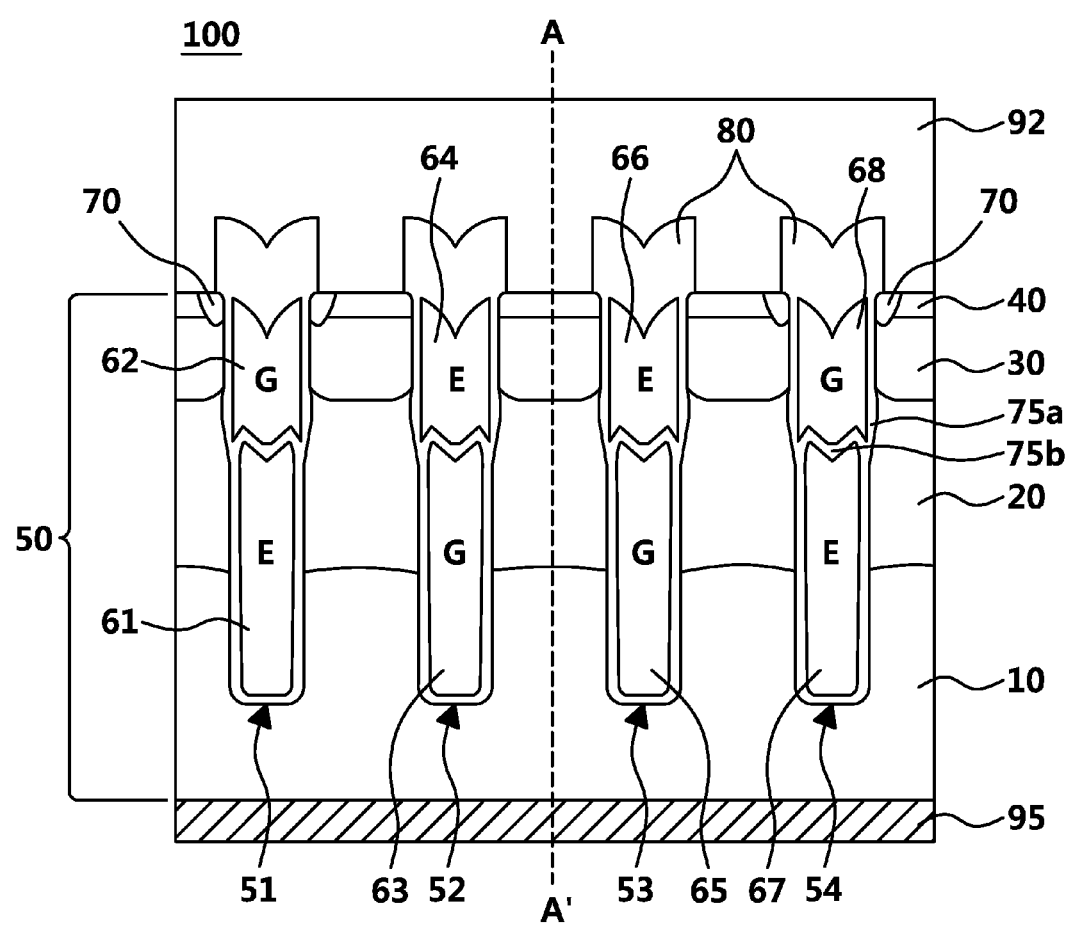
FIG. 1B is a diagram illustrating a power semiconductor device according to an embodiment, which is a cross-sectional view of A-A in FIG. 1A.

FIG. 1B is a diagram illustrating a power semiconductor device 100 according to an embodiment, which is a cross-sectional view of A-A in FIG. ?1A.

As illustrated in the embodiment of FIG. 1B, the power semiconductor device 100 according to an embodiment has a trench structure including a top electrode and a bottom electrode inside a trench. In such an embodiment, a gate voltage is applied to only one of the electrodes.

In the embodiment of FIG. 1B, a substrate 50 has a plurality of trench structures 51, 52, 53, 54, a N-type drift region 10, an N-type well region 20, a P-type body region 30, and a P+-type contact region 40 in a direction from a lower region towards an upper region. Both the P-type body region 30 and the P+-type contact region 40 are formed between the trench structures 51, 52, 53, 54. The N-type drift region 10 surrounds the bottom portion of the trench structures 51, 52, 53, 54. The N-type well region 20 is formed over the N-type drift region 10 and it has a higher concentration than that of the N-type drift region 10. The N-type well region 20 is also disposed between the trench structures 51, 52, 53, 54. In addition, as illustrated in the example of FIG. 1B, a distance from the upper side of the substrate 50 to a lower side of respective regions is to be formed to have an approximately consistent value.

The N-type drift region 10 is formed to have different doping concentrations. Herein, the N-type drift region 10 comprises a first epitaxial layer and a second epitaxial layer. The first epitaxial layer has a higher impurity concentration than that of the second epitaxial layer and it is operated as a field stop region. The second epitaxial layer is formed over the first epitaxial layer.

Trench structures of a plurality of trench structures 51, 52, 53, 54 are formed to have a predetermined depth from the top surface of the substrate 50. The trench structures 51, 52, 53, 54 are separated from each other by a predetermined space. The separation distance between each trench is possibly determined according to electrical characteristics of the power semiconductor device.

Each trench structure 51, 52, 53, 54 includes top electrodes 62, 64, 66 and 68 and bottom electrodes 61, 63, 65 and 67. The trench structure further includes a gate insulation region 75a formed over the sidewall of the trench. In addition, each top electrode is separated from the bottom electrode by a predetermined space. A first insulation region 75b is formed between each top electrode and corresponding bottom electrode. Thus, each top electrode is insulated from the bottom electrode by using the first insulation region 75b. For the convenience of explanation, the four trench structures are referred to as a first trench structure 51, a second trench structure 52, a third trench structure 53, and a fourth trench structure 54 in a horizontal direction. Referring to the embodiment of FIG. 1B, the first trench structure 51 has a bottom electrode 61 and a top electrode 62. The second trench structure 52 has a bottom electrode 63 and a top electrode 64. Similarly, the third trench structure 53 has a bottom electrode 65 and a top electrode 66. The fourth trench structure 54 has a bottom electrode 67 and a top electrode 68. In such an embodiment, all of the bottom and top electrodes are formed using a poly-silicon material. Such a material is also known as polycrystalline silicon and refers to a high purity form of silicon manufactured by a chemical purification process, such as the Siemens process.

The first trench structure 51 is symmetrical to the fourth trench structure 54, and the second trench structure 52 is symmetrical to the third trench structure 53 with respect to A-A' line of symmetry. However, in this embodiment, the first trench structure 51 is not identical to the second trench structure 52. The top electrode 62 and bottom electrode 61 of the first trench structure 51 are connected to a gate pad 94 and an emitter electrode 92, respectively. The gate pad 94 is formed on the semiconductor substrate 50 and the gate pad 94 is supplied with a gate voltage or gate potential. It is to be noted that while the emitter electrode 92 and the gate pad 94 identify similar regions in the two-dimensional representation of FIG. 1B, in that they are both formed on the semiconductor substrate 50, they are configured in a three-dimensional context so that the top electrodes and the bottom electrodes may be connected to one or the other of the emitter electrode 92 and the gate pad 94.

By contrast, the top electrode 64 and the bottom electrode 63 of the second trench structure 52 are connected to the emitter electrode 92 and the gate pad 94, respectively. Such a symmetric structure increases the degree of safety of the present power semiconductor device, according to an embodiment.

Thus, two bottom electrodes 61 and 67 are electrically connected to the emitter electrode 92. Another two bottom electrodes 63 and 65 are electrically connected to the gate pad 94. Two top electrodes 62 and 68 are electrically connected to a gate pad 94. Another two top electrodes 64 and 66 are electrically connected to the emitter electrode 92. Here, a ground voltage is applied to the emitter electrode 92.

The top electrodes 62, 64, 66, 68 and the bottom electrodes 61, 63, 65, 67 are formed in the trench structures 51, 52, 53, 54. Herein, as illustrated in FIG. 1B, the bottom electrodes 61, 63, 65, 67 have upper side indented with a concave shape. The top electrodes 62, 64, 66, 68 have a lower side protruding with a wave shape corresponding to the shape of the bottom electrodes 61, 63, 65, 67.

Further, the top electrodes 62, 64, 66, 68 and the bottom electrodes 61, 63, 65, 67 are formed to have a rectangular shape, and the lower sides of the top electrodes 62, 64, 66, 68 and the upper sides of the bottom electrodes 61, 63, 65, 67 are formed to face each other.

Respective lengths of the top electrodes 62, 64, 66, 68 and the bottom electrodes 61, 63, 65, 67 are determined according to the electrical characteristics of the power semiconductor device 100. Accordingly, for example, as illustrated in the embodiment of FIG. 1, a length of the top electrodes 62, 64, 66, 68 may be formed to be smaller than the length of the bottom electrodes 61, 63, 65, 67 or may be formed to be the same length, according to another embodiment. Alternatively, the length of the top electrodes 62, 64, 66, 68 may be formed to be longer than the length of the bottom electrodes 61, 63, 65, 67.

The top/bottom electrodes are formed to have various depths, as illustrated in FIG. 1B. A depth of the N-type well region 20 is formed to be deeper than a depth of the top electrodes 62, 64, 66, 68 of the trench structures 51, 52, 53, 54 with respect to the top surface of the substrate. However, a depth of the N-type well region 20 is formed to be shallower than a depth of the bottom electrodes 61, 63, 65, 67 of the trench structure with respect to the top surface of the substrate. The N-type well region 20 overlaps with the top electrode and the bottom electrode of the trench structure. $V_{ce}$ decreases due to the N-type well region 20, because the N-type well region 20 has a higher doping concentration than that of the N-type drift region 10. In such an embodiment, $V_{ce}$ refers to the voltage that falls across the collector-emitter junction of the bipolar junction transistor, here, an IGBT.

As illustrated in the embodiment of FIG. 1B, the top electrode 62 of the first trench structure 51 has an equal or greater depth than that of the body region 30 with respect to the top surface of the substrate 50. The channel region is formed to be adjacent to the tope electrode 62. However, no channel region is formed to be adjacent to the bottom electrode 61. Accordingly, since the bottom electrode 61 is not connected to the gate pad 94, no gate potential is applied to the bottom electrode 61. Accordingly, there is no channel region formed adjacent to the bottom electrode 61.

An N+ source region 70 is formed on both sides of first and fourth trench structures 51, 54. In such an embodiment, the source region 70 has a higher impurity concentration than the impurity concentration of the well region 20 or of a drift region 10.

In this embodiment, the N+ source region 70 is formed in the P-type body region 30. The N+ source region 70 contacts both sides of the first trench structure 51 and the fourth trench structure 54. When a gate voltage is applied to the top electrode 62, the trench IGBT transistor turns on. Accordingly, the channel region is opened in the P-type body region 30 and a plurality of electron carriers flow into P-type body region 30. Thus, the electrons move from the emitter electrode 92 to a P+ collector region. However, no N+ source region 70 is formed on both sides of second trench structure 52 and third trench structure 53. Accordingly, no channel region is formed in the P-type body region that is adjacent to the two top electrodes 64 and 66. Because there is no channel region adjacent to the second and third trench structures 152 and 153, the robustness of operation increases in such an IGBT device. For example, the protection ability of such an IGBT against a short circuit condition is improved.

A second insulation region 80 is formed to cover the trench structure. The second insulation region 80 also covers a portion of the top surface of the substrate 50. The emitter electrode 92 is formed on the upper side of the substrate and the second insulation region 80. Put differently, the emitter electrode 92 is formed on top of the substrate and thereby electrically connects to a contact region 40 and the source region 70.

The drain electrode 95 is formed on the bottom surface of the substrate 50. In further detail, in an embodiment, the lower portion of the drift region 10 has an N+ field stop region, a P+ collector region, and drain electrode 95 are formed in a vertical direction, in that order.

Referring to the embodiment of FIG. 1B, a first trench structure 51 and a fourth trench structure 54 are identical. In addition, the second trench structure 52 and the third trench structure 53, which are respectively formed in an inner region are identical. However, the first trench structure 51 is not identical to the second trench structure 52.

That is, referring to the embodiment of FIG. 1B, four trench structures are formed according to an embodiment. However, according to other embodiments, at least three, or possibly five or more trench structures are formed. In addition, a trench structure is formed along the furthest left side and furthest right side to be identical with a first trench structure or a fourth trench structure of FIG. 1B. The rest of the trench structures are possibly formed to be identical with the second trench structure or the third trench structure of the embodiment of FIG. 1B.

A power semiconductor device according to an embodiment forms a split-poly gate structure through the aforementioned technical approaches and accordingly minimizes an unnecessary gate region. As a result, a gate capacitance of a power semiconductor device is able to be reduced.

When (+) current is applied to bottom electrodes 63 and 65, an N-type drift region adjacent to the bottom electrodes 63 and 65 enters into an accumulation mode. If the N-type concentration increases in the N-type drift region, $V_{sat}$ decreases. Here, $V_{sat}$ refers to the saturation voltage for the transistor.

Figure 2A:
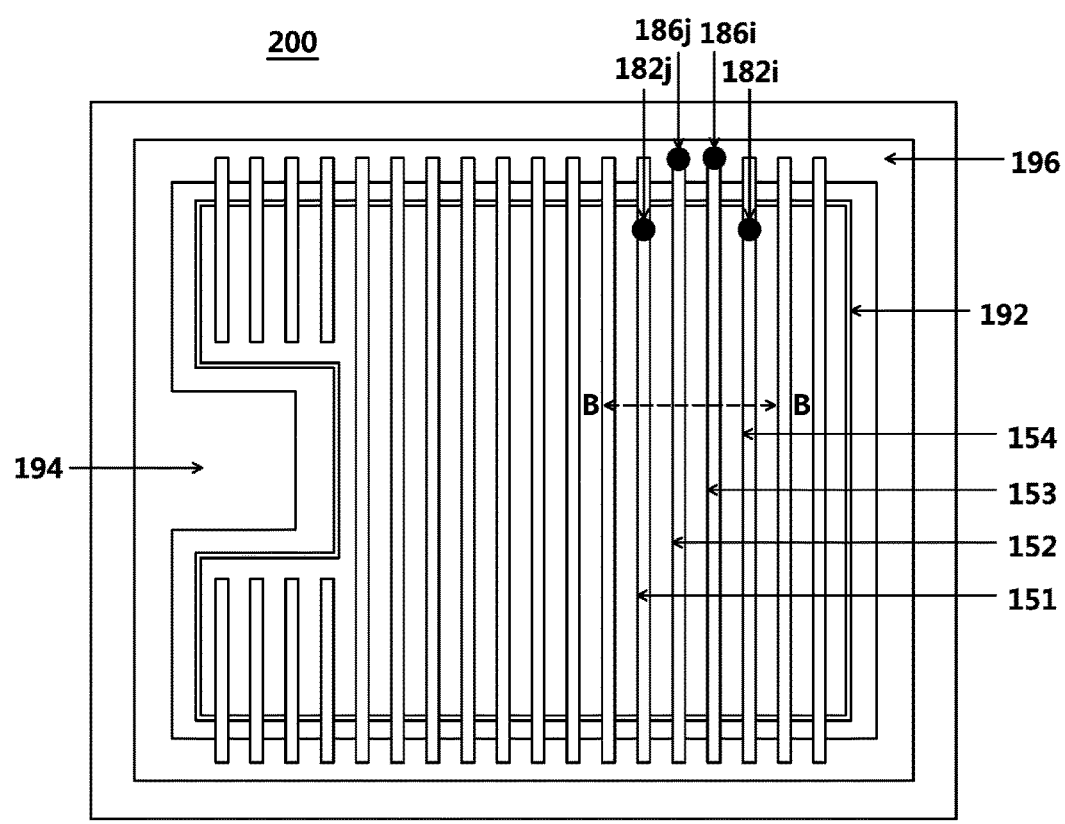
FIG. 2A is a plan view illustrating a power semiconductor device 100 according to an embodiment.

FIG. 2A is a plan view illustrating a power semiconductor device 200 according to an embodiment. Straight lines 151, 152, 153, 154 are a plurality of the trench structures 151, 152, 153, 154 in which are filled by conductive materials, such as poly-Si materials. The trench structures are extended to a gate bus 96 which are formed by conductive metal layer, such as Al, W, Cu. The gate bus 196 surrounded the trench structures 151, 152, 153, 154 and its shape is like a single line. The gate electrodes 162, 168 (see FIG. 2B) formed in the trench structures 151, 154 are electrically connected to gate bus region 96 using gate contact plugs 186$i$, 186$j$. The gate bus 196 is electrically connected to a gate pad 194 to receive a gate voltage. The gate pad 194 has larger width than that of the gate bus 196. A single big emitter electrode 192 covers almost area of trench structures 151, 152, 153, 154, however it is electrically isolated from the gate bus 196. Using emitter contact plugs 182$i$, 182$j$, the emitter electrodes 161, 163, 164, 165, 166, 167 located in the trench structure are electrically connected to the emitter electrode 192 which covers the trench structures 151, 152, 153, 154.

Figure 2B:
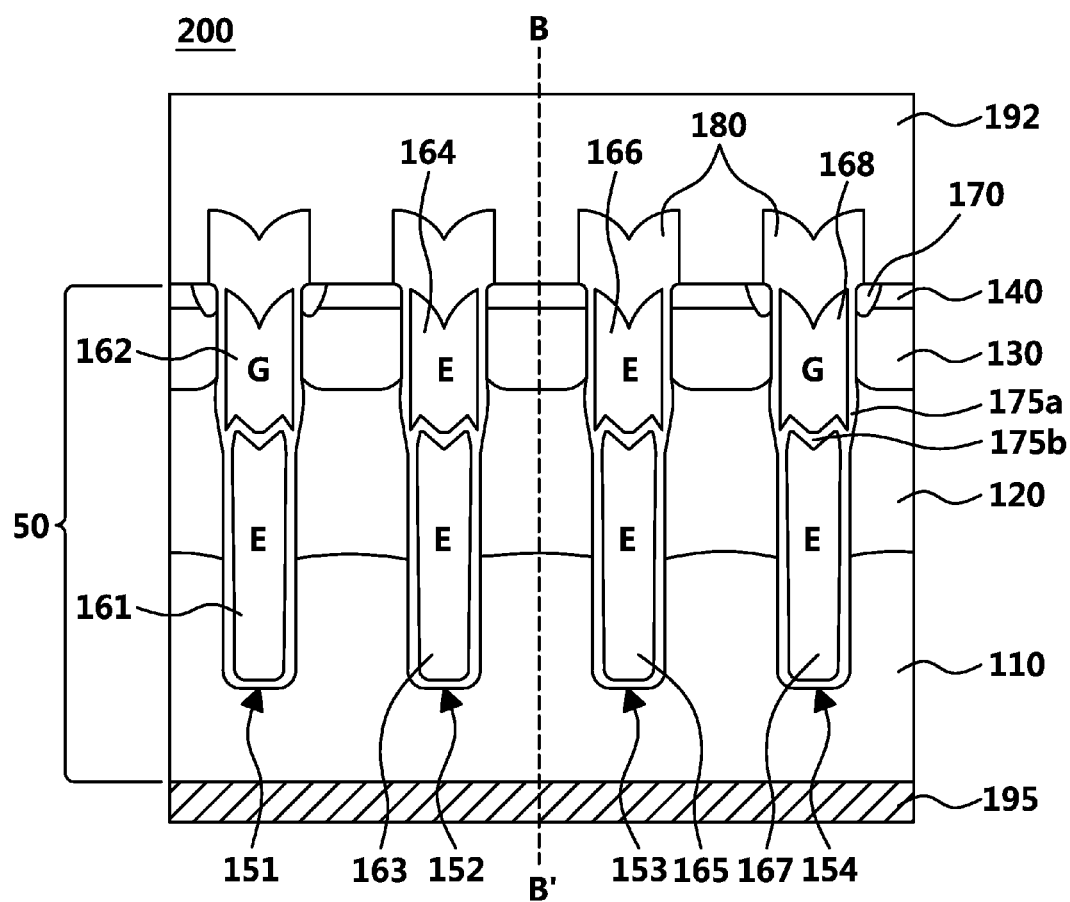
FIG. 2B is a diagram illustrating a power semiconductor device according to an embodiment, which is a cross-sectional view of B-B in FIG. 2A.

FIG. 2B is a diagram illustrating a power semiconductor device according to an embodiment. Further, according to an embodiment, an emitter voltage is applied to the top electrode and bottom electrode of the trench structure and such trench structure is referred to as a dummy trench. The above-described technical approach is illustrated in the embodiment of FIG. 2B., which is a cross-sectional view of B-B in FIG. 2A.

As illustrated in the embodiment of FIG. 2B, a power semiconductor device 200 according to an embodiment has a plurality of trench structures formed in the substrate, including a first trench structure 151, a second trench structure 152, a third trench structure 153 and a fourth trench structure 154. Each trench structure 151, 152, 153, 154 includes a gate insulation region 175$a$, a corresponding top electrode 162, 164, 166, 168, a corresponding bottom electrode 161, 163, 165, 167 and a first insulation region 175$b$ between the corresponding top electrode 162, 164, 166, 168 and the corresponding bottom electrode 161, 163, 165, 167. Also, a gate insulating region 175$a$ is formed in a sidewall of the trench structure.

The power semiconductor device 200 illustrated in FIG. 2B includes an N-type drift region 110, an N-type well region 120, a P-type body region 130, a P+ type contact region 140, such that they are formed in a direction from a lower region to an upper region in a substrate.

Further, in this embodiment, a second insulation region 180 is formed to cover an upper portion of the trench structures 151, 152, 153, 154. An emitter electrode 192 is formed over the substrate 50 and the second insulation region 180. A drain electrode 195 is formed on the bottom surface of the substrate 50.

The first trench structure 151 is formed to be symmetrical to the fourth trench structure 154, and the second trench structure 152 is formed to be symmetrical to the third trench structure 153 with respect to the B-B' line of symmetry in the embodiment of FIG. 2. However, the first trench structure 151 is not identical to the second trench structure 152. In the embodiment of FIG. 2B, the top electrode 162 and the bottom electrode 161 of the first trench structure 151 are connected to the gate pad 194 and the emitter electrode 192, respectively. Both the top electrode 164 and the bottom electrode 163 of the second trench structure 152 are connected to the emitter electrode 192. Such a symmetric structure increases the degree of safety of the present power semiconductor device. In FIG. 2B, all the bottom electrodes of the trench structure are electrically connected to the emitter electrode 192. That is, the emitter voltage is applied to the bottom electrodes 161, 163, 165, 167 of the corresponding trench structures 151, 152, 153, 154 according to an embodiment of FIG. 2B.

The two top electrodes 164 and 166 are also electrically connected to the emitter electrode 192. Another two top electrodes 162 and 168 are electrically connected to the gate pad 194. Therefore, the second trench structure 152 and the third trench structure 153 differ from the first trench structure 151 and the fourth trench structure 154. Also, in this embodiment, the bottom electrodes 163, 164, 165, 166 have a ground voltage. In addition, in an embodiment, the top electrodes 162, 168 have a gate voltage.

In the embodiment of FIG. 2B, a depth of the N-type well region 120 is deeper than a corresponding depth of the top electrodes 162, 164, 166, 168 of the trench structures 151, 152, 153, 154, with respect to the top surface of the substrate. Also, a depth of the N-type well region 120 is shallower than a depth of the bottom electrodes 161, 163, 165, 167 of the trench structures 151, 152, 153, 154. Thus, in this embodiment, the N-type well region 120 overlaps with the top electrode and the bottom electrode of the trench structure. The $V_{ce}$ value, as discussed above further with respect to the embodiment of FIG. 1B, further decreases due to the presence and attributes of N-type well region 120 as specified, because the N-type well region 120 has a higher doping concentration than the doping concentration of N-type drift region 110.

Because all of the bottom electrodes 161, 163, 165 and 167 are not electrically connected to the gate pad 194 in the embodiment of FIG. 2B, $V_{sat}$ slightly increases compared to $V_{sat}$ of the embodiment of FIG. 1B. However, top electrodes 164 and 166 are connected to emitter electrode 192 and accordingly cannot function further as gate electrodes. Accordingly, no gate-collector capacitance between the top electrodes 164 and 166 and the P+ collector region is able to occur. Since gate-collector capacitance is accordingly reduced, the on-off switching speed of a structure of FIG. 2B becomes faster than the on-off switching speed of a structure of FIG. 1B. This switching speed increase occurs because a capacitance value which contributes to a delay time becomes smaller.

An N+ source region 170 is formed on both sides of a first trench structure 151 and a fourth trench structure 154. In this example, the N+ source region 170 is formed in the P-type body region 130. Accordingly, a channel region is formed between the N+ high concentration source region 170 and the N-type well region 120. The channel region is formed in P-type body region 30. When a gate voltage is applied to the top electrode, the trench IGBT transistor turns on. The channel region is opened in the P-type body region 30. As a result, a plurality of electron carriers flow into the P-type body region 30. Accordingly, the electrons move from the emitter electrode 192 to a collector region.

However, no N+ source region 170 is formed adjacent to the second and third trench structures 152 and 153. Because no N+ source region 170 is formed on either side of the second and third trench structures 152 and 153 that are electrically connected with the emitter electrode, the lack of such an N+ source region accordingly prevents formation of a channel region. As a result, no channel region is formed in the P-type body region 130 that is on both sides of the second and third trench structures 152 and 153. If there is no channel region adjacent to the second and third trench structures 152 and 153, the robustness of the IGBT device increases. For example, the protection of the IGBT against short circuit conditions is improved.

Figure 3:
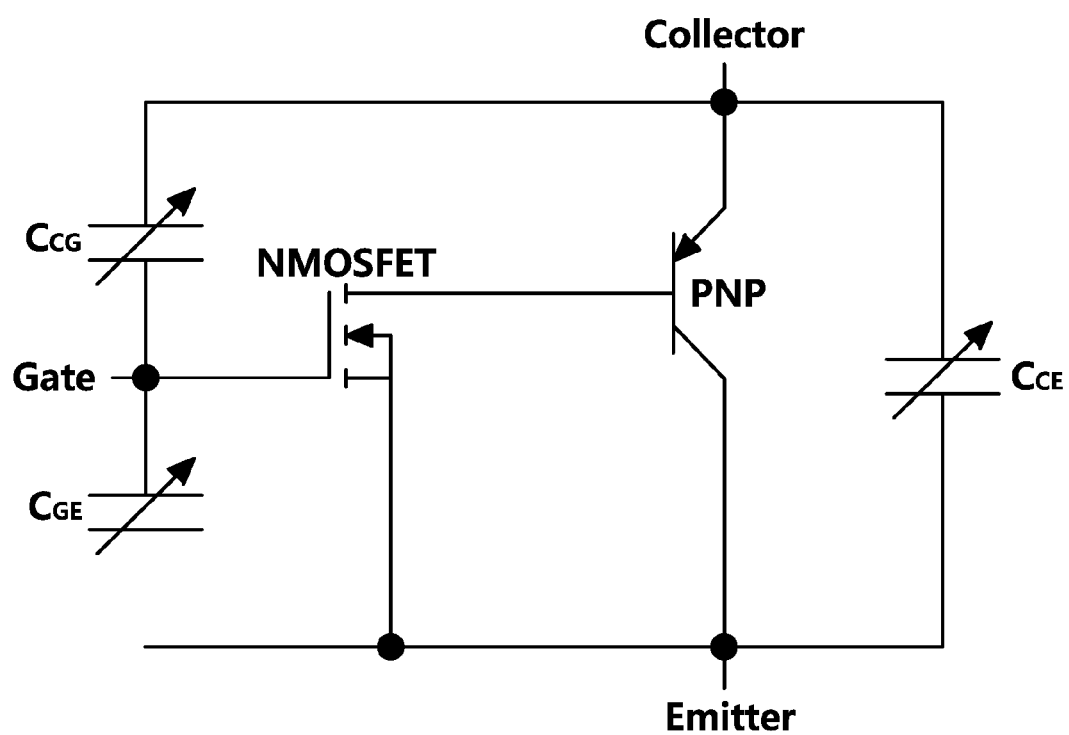
FIG. 3 is a diagram illustrating a capacitance of an IGBT transistor device.

FIG. 3 is a general block diagram illustrating a capacitance of an IGBT transistor device according to an embodiment. When modeling the capacitance values illustrated in FIG. 3, it can be illustrated as the following Equations 1 to 3. In this embodiment, $C_{ies}$ refers to a capacitance value of an input terminal when a collector and an emitter of a power semiconductor device is electrically shorted, and $C_{oes}$ refers to a capacitance value of an output terminal when a gate and an emitter of a power semiconductor device is electrically shorted, and $C_{res}$ refers to a capacitance between a collector and a gate terminal is electrically shorted.

$$C_{ies}=C_{GE}+C_{CG} \qquad \text{Equation 1}$$

$$C_{oes}=C_{CE}+C_{CG} \qquad \text{Equation 2}$$

$$C_{res}=C_{CG} \qquad \text{Equation 3}$$

In this embodiment, $C_{GE}$ is a capacitance between a gate electrode and an emitter electrode of a power semiconductor device. $C_{CE}$ is a capacitance between a P+ collector region and an emitter of a power semiconductor device. $C_{CG}$ is a capacitance between the P+ collector region and gate electrode of a power semiconductor device.

A switching speed is determined based on a charging speed of an input capacitance. The smaller the input capacitance, the faster the switching speed becomes.

According to an embodiment, the switching speed increases by removing $C_{CG}$, which is the capacitance between the collector and the gate electrode. If the gate capacitance $C_{CG}$ is removed, $C_{ies}=C_{GE}$, $C_{oes}=C_{CE}$ and $C_{res}=0$ in the Equations 1 to 3 presented above. Accordingly, the switching speed is able to dramatically increase.

Figure 4:
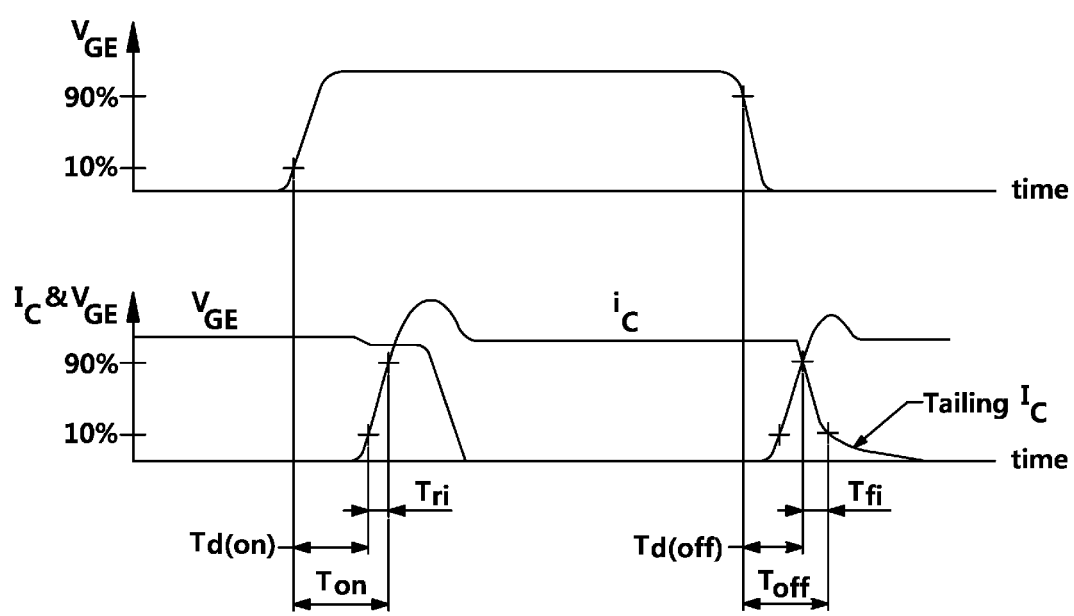
FIG. 4 is a diagram illustrating switching speed of a power semiconductor device according to an embodiment.

FIG. 4 is a diagram illustrating a switching speed of a power semiconductor device according to an embodiment.

As illustrated in the example of FIG. 4, $T_{d(on)}$ refers to a time during which the collector current $I_c$ increases from 0% to 10% of a rating current, where a rating current is an RMS electric current that a device or conductor is able to continuously carry while remaining within its temperature rating and avoiding deterioration. $T_{d(off)}$ refers to a time that $I_c$ collector current decreases from the rating current to 90%. The $t_{d(on)}$ and $t_{d(off)}$ refer to the switching on and switching off times, respectively. In addition, $T_{ri}$ refers to a time during which collector current $I_c$ increases from 10% to 90% of the rating current. $T_{fi}$ refers to a time during which the collector current $I_c$ decreases from 90% to 10% of the rating current. Both the $t_{d(on)}$ and $t_{d(off)}$ usually have larger values than those of the $T_{ri}$ and $T_{fi}$. If the $t_{d(on)}$ and $t_{d(off)}$ have larger values than those of the $T_{ri}$ and $T_{fi}$, the switching loss is accordingly increased in the IGBT device.

The $t_{d(on)}$ and $t_{d(off)}$ values are related to the gate-collector capacitance. If the gate-collector capacitance has a lower value, $t_{d(on)}$ and $t_{d(off)}$ are reduced accordingly. As a result, the switching on and switching off times are also shortened. Finally, the switching loss is potentially decreased. In an example of a structure of the embodiments of FIGS. 1 and 2, some of the gate-collector capacitance value is removed. As a result, $t_{d(on)}$ and $t_{d(off)}$ value are decreased in the example of FIG. 4. The switching on and switching off times are shortened due to a reduction in gate capacitance. The structure of the embodiment of FIG. 2B is preferable to speed-up switching on-off time, in that the reduction in gate capacitance is greater and further shorten switching on and switching off times.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power semiconductor device, comprising:
   a semiconductor substrate;
   trench structures comprising a first, a second, a third and a fourth trench structure formed in the substrate;
   a second conductivity type body region formed between the trench structures;
   a first conductivity type source region formed in the second conductivity type body region; and
   an emitter electrode and a gate pad formed over the substrate,
   wherein each trench structure comprises a top electrode and a bottom electrode, and each top electrode is insulated from a corresponding bottom electrode, and
   wherein the first trench structure is symmetric to the fourth trench structure, and the second trench structure is symmetric to the third trench structure, and
   wherein the first conductivity type source region is formed to be adjacent to the first trench structure and the fourth trench structure.

2. The power semiconductor device of claim 1, wherein the top electrode and the bottom electrode of the first trench structure are connected to the gate pad and the emitter electrode, respectively, and
   wherein the top electrode and the bottom electrode of the second trench structure are connected to the emitter electrode and the gate pad, respectively.

3. The power semiconductor device of claim 1, wherein the top electrode and the bottom electrode of the first trench structure are connected to the gate pad and the emitter electrode, respectively, and
   wherein both the top electrode and the bottom electrode of the second trench structure are connected to the emitter electrode.

4. The power semiconductor device of claim 1, wherein the second conductivity type body region has a shallower depth than that of the top electrode of the trench structures with respect to the top surface of the substrate.

5. The power semiconductor device of claim 1, further comprising a first conductivity type drift region formed in the substrate, surrounding a bottom portion of the trench structure;
   a first conductivity type well region formed over the first conductivity type drift region; and
   a drain electrode formed on a bottom surface of the substrate.

6. The power semiconductor device of claim 5, wherein the first conductivity type well region overlaps with both the top electrodes and the bottom electrodes of the trench structures.

7. The power semiconductor device of claim 5, wherein the first conductivity type well region has a higher impurity concentration than that of the first conductivity type drift region.

8. The power semiconductor device of claim 5, wherein the drift region comprises a first epitaxial layer and a second epitaxial layer, wherein the first epitaxial layer has a higher impurity concentration than that of the second epitaxial layer.

9. The power semiconductor device of claim 1, wherein the top electrodes have a smaller length than that of the bottom electrodes.

10. The power semiconductor device of claim 1, wherein no channel region is formed in the body region adjacent to the second trench structure and the third trench structure.

11. The power semiconductor device of claim 1, wherein each top electrode of the first and the fourth trench structures is a gate electrode, and each top electrode of the second and third trench structures is an emitter.

12. The power semiconductor device of claim 1, wherein the four corresponding top electrodes are separated from each other.

13. A power semiconductor device, comprising:
    a substrate;
    first, second, third, and fourth trench structures, in the substrate, each comprising a top electrode and a bottom electrode insulated from each other;
    a drift region of a first conductivity type in the substrate;
    a well region of a first conductivity type formed over the drift region and overlapping with each of the top and bottom electrodes;
    a body region formed over the well region; and
    a source region formed in the body region.

14. The power semiconductor device of claim 13, further comprising an emitter electrode and a gate pad formed over the substrate.

15. The power semiconductor device of claim 14, wherein the top electrode and the bottom electrode of the first trench structure are connected to the gate pad and the emitter electrode, respectively, and
    wherein the top electrode and the bottom electrode of the second trench structure are connected to the emitter electrode and the gate pad, respectively.

16. The power semiconductor device of claim 14, wherein the top electrode and the bottom electrode of the first trench structure are connected to the gate pad and the emitter electrode, respectively, and
    wherein both the top electrode and the bottom electrode of the second trench structure are connected to the emitter electrode.

17. The power semiconductor device of claim 13, wherein the body region has a shallower depth than that of the top electrodes of the trench structures with respect to a top surface of the substrate.

18. The power semiconductor device of claim 13, wherein the well region is disposed between each of the first, second, third, and fourth trench structures.

19. The power semiconductor device of claim 13, wherein the well region has a higher dopant impurity concentration than that of the drift region.

20. The power semiconductor device of claim 13, further comprising:
   a drain electrode formed on a bottom surface of the substrate.

21. The power semiconductor device of claim 13, wherein the top electrodes have a smaller length than that of the bottom electrodes.

22. The power semiconductor device of claim 13, wherein no channel region is formed in the body region between the second trench structure and the third trench structure.

23. The power semiconductor device of claim 13, wherein the source region is in contact with both sides of the first and fourth trench structures and neither side of the second and third trench structures.

* * * * *